(12) United States Patent
Bower et al.

(10) Patent No.: US 9,980,341 B2
(45) Date of Patent: May 22, 2018

(54) MULTI-LED COMPONENTS

(71) Applicant: X-Celeprint Limited, Cork (IE)

(72) Inventors: Christopher Bower, Raleigh, NC (US); António José Marques Trindade, Cork (IE); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days. days.

(21) Appl. No.: 15/710,180

(22) Filed: Sep. 20, 2017

(65) Prior Publication Data

US 2018/0084614 A1  Mar. 22, 2018

Related U.S. Application Data

(60) Provisional application No. 62/398,007, filed on Sep. 22, 2016.

(51) Int. Cl.
*H05B 33/08* (2006.01)
*H05B 37/02* (2006.01)

(52) U.S. Cl.
CPC ....... *H05B 33/089* (2013.01); *H05B 33/0872* (2013.01); *H05B 37/0218* (2013.01)

(58) Field of Classification Search
CPC .............. H01L 25/0753; H01L 33/62; H01L 2224/32225; H01L 2224/48227; H01L 2224/73265; H01L 2924/00; H01L 2924/00012; H05B 33/06; H05B 33/0827;
(Continued)

(56) References Cited

U.S. PATENT DOCUMENTS

| 4,746,202 A | 5/1988 | Perilloux et al. |
| 5,060,027 A | 10/1991 | Hart et al. |
| 5,550,066 A | 8/1996 | Tang et al. |

(Continued)

FOREIGN PATENT DOCUMENTS

| CN | 103677427 A | 3/2014 |
| EP | 1662301 A1 | 5/2006 |

(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).

(Continued)

*Primary Examiner* — Haissa Philogene
(74) *Attorney, Agent, or Firm* — William R. Haulbrook; Choate, Hall & Stewart LLP

(57) ABSTRACT

A multi-LED component comprises a component substrate comprising a common electrode, a first electrode, a second electrode, a plurality of first LEDs, and a plurality of second LEDs all disposed on the component substrate. Each first LED and each second LED comprises first and second LED contacts for providing power to each corresponding LED to cause the LED to emit light. The first LED contact of each first LED and each second LED is electrically connected to the common electrode. The second LED contacts of the first LEDs are electrically connected to the first electrode. The second LED contacts of the second LEDs are electrically connected to the second electrode so that the first LEDs are electrically connected in parallel and the second LEDs are electrically connected in parallel.

20 Claims, 11 Drawing Sheets

(58) Field of Classification Search
CPC .............. H05B 33/089; H05B 33/0872; H05B 37/0218
See application file for complete search history.

(56) References Cited

U.S. PATENT DOCUMENTS

| | | | |
|---|---|---|---|
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,901,578 B2 * | 12/2014 | Kobayakawa ........ H01L 29/866 257/88 |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,022,632 B2 * | 5/2015 | Kim .................... G02B 6/0023 257/678 |
| 9,048,449 B2 | 6/2015 | Kim et al. |
| 9,105,813 B1 | 8/2015 | Chang |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,818,725 B2 | 11/2017 | Bower et al. |
| 9,860,955 B2 * | 1/2018 | Kim .................... H05B 33/086 |
| 2001/0022564 A1 | 9/2001 | Youngquist et al. |
| 2002/0096994 A1 | 7/2002 | Iwafuchi et al. |
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |

(56) References Cited

U.S. PATENT DOCUMENTS

| | | |
|---|---|---|
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0056835 A1 | 3/2012 | Choo et al. |
| 2012/0105518 A1 | 5/2012 | Kang et al. |
| 2012/0126229 A1 | 5/2012 | Bower |
| 2012/0141799 A1 | 6/2012 | Kub et al. |
| 2012/0206428 A1 | 8/2012 | Cok |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372187 A1 | 12/2015 | Bower et al. |
| 2016/0004123 A1 | 1/2016 | Tanabe |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0260388 A1 | 9/2016 | Yata et al. |
| 2016/0266697 A1 | 9/2016 | Cheng et al. |
| 2016/0364030 A1 | 12/2016 | Peana et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0352646 A1 | 12/2017 | Bower et al. |

(56) References Cited

U.S. PATENT DOCUMENTS

| | | |
|---|---|---|
| 2017/0357127 A1 | 12/2017 | Cok et al. |
| 2017/0358717 A1 | 12/2017 | Cok et al. |

FOREIGN PATENT DOCUMENTS

| | | | |
|---|---|---|---|
| EP | 2078978 | A2 | 7/2009 |
| EP | 2148264 | A2 | 1/2010 |
| EP | 2 610 314 | A1 | 7/2013 |
| EP | 2703969 | A2 | 3/2014 |
| GB | 2 496 183 | A | 5/2013 |
| JP | 11-142878 | | 5/1999 |
| WO | WO-2006/027730 | A1 | 3/2006 |
| WO | WO-2006/099741 | A1 | 9/2006 |
| WO | WO-2008/103931 | A2 | 8/2008 |
| WO | WO-2010/032603 | A1 | 3/2010 |
| WO | WO-2010/111601 | A2 | 9/2010 |
| WO | WO-2010/132552 | A1 | 11/2010 |
| WO | WO-2013/064800 | A1 | 5/2013 |
| WO | WO-2013/165124 | A1 | 11/2013 |
| WO | WO-2014/121635 | A1 | 8/2014 |
| WO | WO-2014/149864 | A1 | 9/2014 |
| WO | WO-2015/088629 | A1 | 6/2015 |
| WO | WO-2015/193434 | A2 | 12/2015 |
| WO | WO-2016/030422 | A1 | 3/2016 |
| WO | WO-2016/046283 | A2 | 3/2016 |
| WO | WO-2017/042252 | A1 | 3/2017 |
| WO | WO-2017/060487 | A2 | 4/2017 |
| WO | WO-2017/149067 | A1 | 9/2017 |
| WO | WO-2017/174632 | A1 | 10/2017 |

OTHER PUBLICATIONS

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 Digest, 40(2):947-950 (2009).

Johnson, K. et al., Advances in Red VCSEL Technology, Advances in Optical Technologies, 2012:569379, 13 pages (2012).

Kasahara, D. et al, Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Lee, S. H. etal, Laser Lift-Offof GaN Thin Film and its Application to the Flexible Light Emitting Diodes, Proc. of SPIE 8460:846011-1-846011-6 (2012).

Matioli, E. et al., High-brightness polarized light-emitting diodes, Light: Science & Applications, 1:e22:1-7 (2012).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Seurin, J.F. et al, High-power red VCSEL arrays, Proc. of SPIE 8639:1-9 (2013).

Yaniv et al., A 640 + 480 Pixel Computer Display Using Pin Diodes with Device Redundancy, 1988 International Display Research Conference, IEEE, CH-2678-1/88:152-154 (1988).

Yoon, J. et al., Heterogeneously Integrated Optoelectronic Devices Enabled by MicroTransfer Printing, Adv. Optical Mater. 3:1313-1335 (2015).

\* cited by examiner

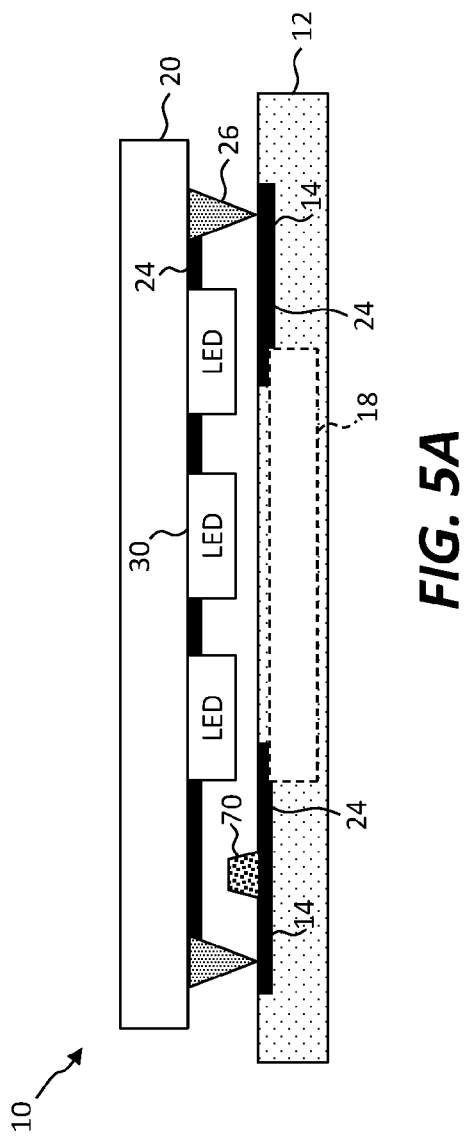
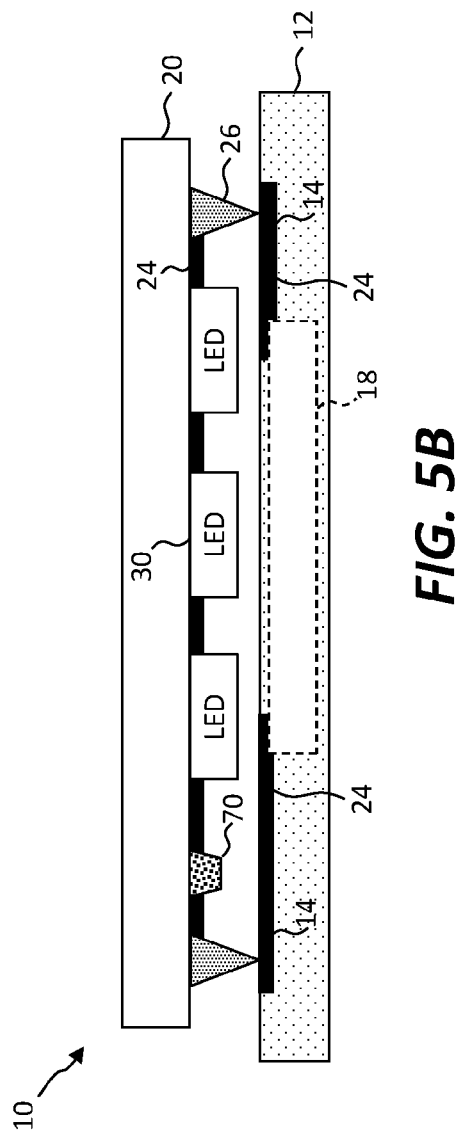

MULTI-LED COMPONENTS

PRIORITY APPLICATION

This application claims the benefit of U.S. Provisional Patent Application No. 62/398,007, filed on Sep. 22, 2016, entitled "Multi-LED Component," the content of which is hereby incorporated by reference herein in its entirety.

RELATED APPLICATIONS

Reference is made to U.S. Provisional Patent Application No. 62/395,001, filed Sep. 15, 2016, entitled "Electrically Parallel Fused LEDs," by Bower et al., the content of which is incorporated by reference herein in its entirety.

FIELD OF THE INVENTION

The present invention relates to assemblies of inorganic light-emitting diodes electrically connected in parallel.

BACKGROUND OF THE INVENTION

Light-emitting diodes (LEDs) are widely used, inter alia, in lamps or other illuminators, as indicators in electronic devices, and in large-format displays. For example, displays using LEDs are found in outdoor signage and stadium displays.

Inorganic light-emitting diode displays using inorganic micro-LEDs on a display substrate are also known. Micro-LEDs can have an area less than 1 mm square, less than 100 microns square, or less than 50 microns square or have an area small enough that it is not visible to an unaided observer of the display at a designed viewing distance. U.S. Pat. No. 8,722,458 entitled "Optical Systems Fabricated by Printing-Based Assembly" teaches transferring light-emitting, light-sensing, or light-collecting semiconductor elements from a wafer substrate to a system substrate.

In any application requiring many elements, it is important that each element is reliable to ensure good manufacturing yields and performance. Because no manufacturing process is perfect, any large system with many components can have defective elements. In particular, inorganic light-emitting diodes are subject to manufacturing defects that increase the amount of current passing through the LED when provided with power, resulting in an undesirable brightness or power usage, or system control problems, for example.

An undesired increase in current can also overheat the LEDs. One approach to preventing such overheating is to provide each LED with a resistor or group of resistors in series with the LED, as is described in U.S. Pat. No. 9,226,361. U.S. Patent Application Publication No. 2016/0057827 A1 discloses a current-limiting diode in an LED circuit for a lighting system with both forward-biased and reverse-biased LEDs and a polarity switching device. Circuits for sensing current levels and reducing power dissipation are also known, for example as taught in U.S. Patent Application Publication Nos. 2016/0057822 A1 and 2016/0057832 A1, as are voltage-control circuits, for example as described in U.S. Patent Application Publication No. 2016/0056725 A1. However, these approaches either require complex or expensive circuit components in association with each LED or result in diminished light output.

Alternatively, to ensure that large multi-element systems are reliably manufactured and operated, such systems can employ redundant elements. For example, displays are sometimes designed with redundant light emitters. U.S. Pat. No. 5,621,555 describes an LCD with redundant pixel electrodes and thin-film transistors to reduce defects. In another approach, described in U.S. Pat. No. 6,577,367, an extra row or column of pixels is provided to replace any defective row or column. Another approach to improving display yields uses additional, redundant light-emitting elements, for example two light emitters for every desired light emitter in the display. U.S. Pat. No. 8,766,970 discloses a pixel circuit with two sub-pixels and circuitry to determine whether a sub-pixel is to be enabled, for example if another sub-pixel is faulty. Similarly, U.S. Pat. No. 7,012,382 teaches an LED-based lighting system that includes a primary light source and at least one redundant light source. The primary light source is activated by itself and the performance of the light source is measured to determine whether or not to drive the redundant light source. The redundant light source is activated when the performance measurements indicate that a performance characteristic is not being met by the primary light source alone. The first light system can be activated in combination with the redundant light source once the decision is made to activate the redundant light source. U.S. Pat. No. 8,791,474 discloses redundant pairs of micro LED devices driven by a common transistor. WO 2014/149864 describes separately controlled micro-LED devices. However, the use of redundant emitters can be expensive and generally does not address problems with LEDs that conduct too much current.

There is a need, therefore, for LED circuits that can control or avoid problems resulting from LEDs in a display, lamp, or other light-emitting device that undesirably conduct too much current or do not emit the desired amount or color of light or both.

SUMMARY OF THE INVENTION

The present invention includes, inter alia, multi-LED components, each comprising a component substrate having opposing sides. A common electrode, a first electrode, and a second electrode are disposed on, in, or over one of the opposing sides of the component substrate. A first plurality of first LEDs and a second plurality of second LEDs are both disposed on, in, or over the side of the component substrate. Each first and each second LED includes first and second LED contacts for providing power to the LED to cause the LED to emit light. The first LED contact of the first and second LEDs is at least indirectly electrically connected to the common electrode. The second LED contacts of the first LEDs are at least indirectly electrically connected to the first electrode and the second LED contacts of the second LEDs are at least indirectly electrically connected to the second electrode so that the first LEDs are electrically connected in parallel and the second LEDs are electrically connected in parallel.

In some embodiments, the first LEDs and the second LEDs are micro-transfer printed LEDs that each have a broken tether or at least a portion of a tether. In some embodiments, the multi-LED component can comprise common, first, and second connection posts electrically connected to the common, first, and second electrodes, respectively, to provide electrical connections to external electrical devices. In some embodiments, the multi-LED component does not include connection posts.

In some embodiments, the LEDs are micro-transfer printed from one or more LED sources wafers to the component substrate and each LED includes at least a portion of a tether or a broken tether.

In some embodiments, the number of first LEDs is different from the number of second LEDs in a multi-LED component. The plurality of first LEDs can include five or more first LEDs, ten or more first LEDs, twenty or more first LEDs, fifty or more first LEDs, or one hundred or more first LEDs. Similarly, the plurality of second LEDs can include five or more second LEDs, ten or more second LEDs, twenty or more second LEDs, fifty or more second LEDs, or one hundred or more second LEDs.

The first and second LEDs can be arranged in a variety of ways and emit a variety of colors of light according to a corresponding variety of embodiments of the present invention. In some embodiments, at least one of the first LEDs is disposed between two or more of the second LEDs to provide visual and perceptual color mixing. The first LEDs can emit light of a first color and the second LEDs can emit light of a second color different from the first color. In some embodiments, the first color is yellow and the second color is blue and a combination of the first and second LEDs together emit light that is perceived by the human visual system as white light. In some embodiments, at least one of the second LEDs is disposed closer to a first LED than to another second LED to enhance visual and perceptual color mixing, particularly where a combination of the first and second LEDs together emit light that is perceived by the human visual system as white light.

In some embodiments, the multi-LED component comprises a third electrode formed on or over the component substrate and a third plurality of third LEDs are disposed on, in, or over the side of the component substrate. Each third LED of the third plurality of third LEDs includes first and second LED contacts for providing power to the third LED to cause the third LED to emit light. The first LED contacts of the third LEDs are at least indirectly electrically connected to the common electrode and the second LED contacts of the third LEDs are at least indirectly electrically connected to the third electrode.

If third LEDs are present, the third LEDs can emit light of a third color different from the first color and different from the second color. In some embodiments, wherein an embodiments includes the first, second LEDs, and third LEDs, for example, the first color is red and the second color is green, and the third color is blue. In some embodiments, at least one of the third LEDs is disposed closer to a first LED and closer to a second LED than to another third LED, to enhance visual and perceptual color mixing, particularly where a combination of the first, second, and third LEDs together emit light that is perceived by the human visual system as white light.

The number of first LEDs can be different from the number of second LEDs, the number of first LEDs can be different from the number of third LEDs, or the number of second LEDs can be different from the number of third LEDs. Different numbers of different first, second, or third LEDs can control the white point of the light emitted from the multi-LED component.

In some embodiments, the component substrate is substantially transparent to the light emitted by the first and second LEDs.

In some embodiments, one or more photo-sensors are sensitive to the light emitted by the first or second LEDs, or both. The photo-sensors can optionally include color filters or an infrared blocking filter, for example to provide frequency-dependent light sensing. In one configuration, the photo-sensors are disposed on the side of the component substrate opposite the first and second LEDs. In another configuration, the photo-sensors are disposed on the same side of the component substrate as the first and second LEDs.

According to some embodiments of the present invention, a fuse is electrically connected in series between each first LED contact and the common electrode. Alternatively, or in addition, a fuse is electrically connected in series between each second LED contact of the first LEDs and the first electrode or between each second LED contact of the second LEDs and the second electrode, or both.

In some embodiments, first and second bond pads (electrical connection pads) electrically connect to the first and second electrodes, respectively, and a fuse is electrically connected in series between the first electrode and the first bond pad or between the second electrode and the second bond pad. Alternatively, or in addition, a common bond pad electrically connects to the common electrode and a fuse is electrically connected in series between the common electrode and the common bond pad.

In some embodiments, a fuse is electrically connected in series with an LED and the fuse is electrically non-conductive.

In some embodiments of the present invention, the multi-LED component includes a system substrate with a circuit that is electrically connected to the common, first, and second electrodes. The component substrate can be located between the system substrate and the LEDs or the LEDs can be located between the system substrate and the component substrate. In various embodiments, the system substrate can be at least one of a semiconductor substrate, a glass substrate, a plastic substrate and an integrated circuit. The integrated circuit can include one or more photo-sensors sensitive to the light emitted from the first or second LEDs. The photo-sensors can optionally include color filters or an infrared blocking filter.

An adhesive can be disposed between the system substrate and the component substrate to adhere the system substrate to the component substrate.

The multi-LED component can include common, first, and second bond pads electrically connected to the common, first, and second electrodes respectively. A third bond pad can be electrically connected to the third electrode, if present. The bond pads can be disposed on the system substrate, the component substrate, or both the system and the component substrate. The bond pads provide a mechanism for electrical connections, for example using wire-bonds, flip-chip structures, or photolithographically defined electrical connections.

In some embodiments of the present invention, a method of making a multi-LED component includes providing a multi-LED component having a fuse electrically connected in series with a defective LED. Electrical power is applied to the common and first or second electrodes so that the fuse associated with the defective LED is rendered non-conductive. In some embodiments, a light emission standard is provided, the light output of each LED is tested and compared to the light-emission standard, and each LED is determined to meet, or not meet, the standard. If the LED does not meet the standard, at least one of the corresponding fuses is rendered non-conductive.

In some embodiments, the LEDs or fuses, or a fused LED including an LED with an integrated fuse, are provided or printed using micro-transfer printing and any one or more of the LEDs, the fuses, or the fused LEDs includes at least a portion of a tether or a broken or fractured tether.

Certain embodiments of the present invention provide a simple way for LED circuits to control or avoid problems resulting from LEDs in a display, lamp, or other light-emitting device, that undesirably conduct too much current, do not emit light, or are otherwise faulty.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 5A-5B are different schematic cross sections of a multi-LED component and a system substrate with a photo-sensor according to illustrative embodiments of the present invention;

Figure 1A:
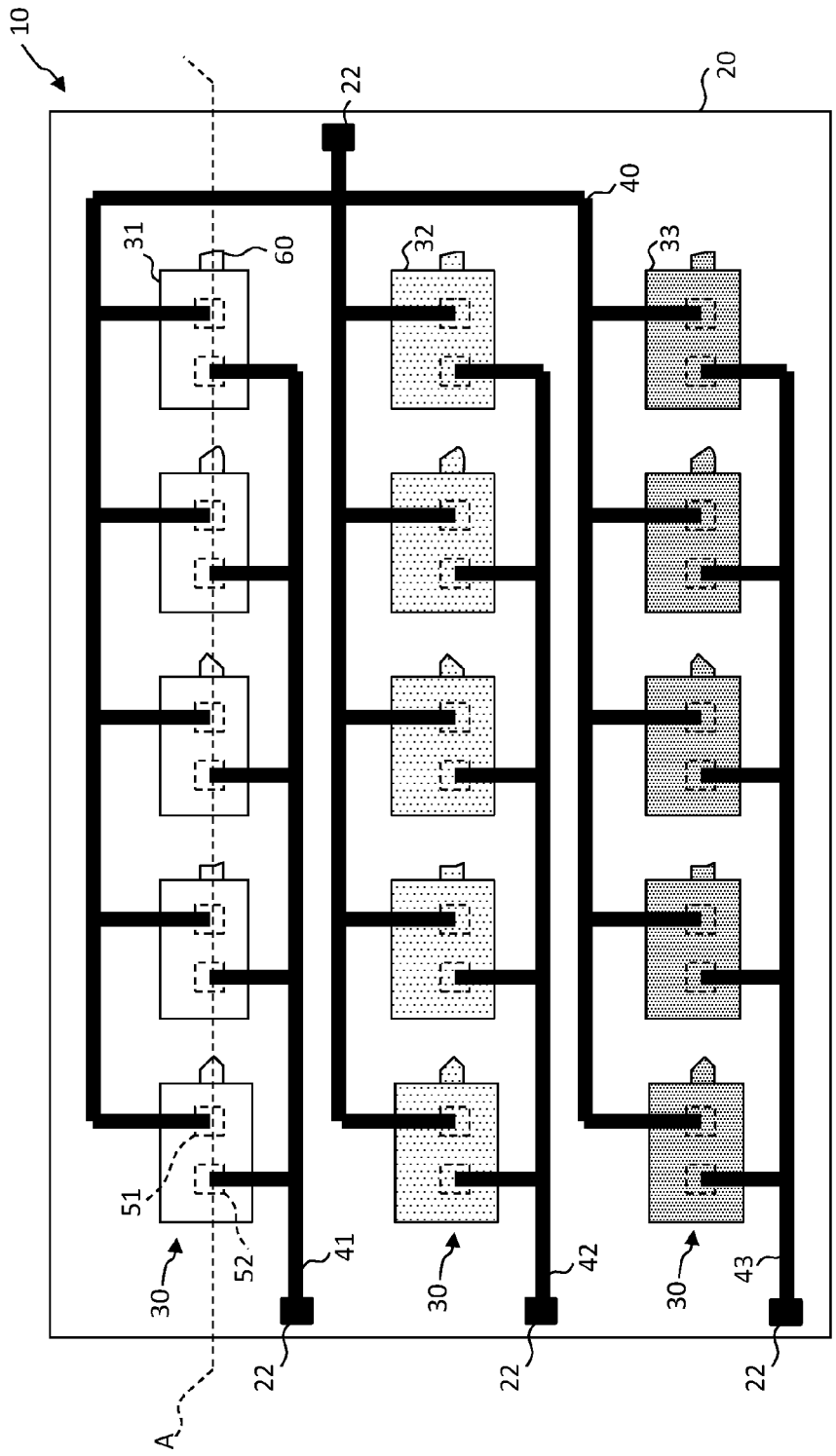
FIG. 1A is a schematic plan view of a multi-LED component according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides, inter alia, a simple way to provide robust LED emission systems, to overcome LED manufacturing faults in a multi-LED component, and to enable simple detection or repair of the multi-LED component. The multi-LED component in accordance with certain embodiments of the present invention can be used in a wide variety of applications, including, for example, in displays, for illumination, and for indicators.

Figure 1B:
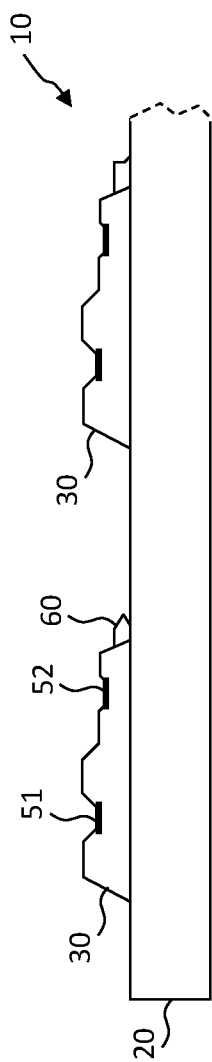
FIG. 1B is a schematic partial cross section of the multi-LED component of FIG. 1A taken along cross section line A according to illustrative embodiments of the present invention.

Referring to the plan view schematic illustration of FIG. 1A and the corresponding partial cross section schematic illustration of FIG. 1B taken along a portion of cross section A of FIG. 1A, in some embodiments of the present invention a multi-LED component 10 includes a component substrate 20 having opposing sides. A common electrode 40, a first electrode 41, and a second electrode 42 are disposed on, in, or over a side of the component substrate 20. A first plurality of first LEDs 31 and a second plurality of second LEDs 32 (collectively LEDs 30) are both disposed on, in, or over the side of the component substrate 20. Each LED 30 includes first and second LED contacts 51, 52 for providing power to the LED 30 to cause the LED 30 to emit light. The first and second LED contacts 51, 52 can be designated portions of the LED 30 or metalized portions of the LED 30 to which electrical contact to the LED 30 can be made. The first LED contacts 51 of the first and second LEDs 31, 32 are at least indirectly electrically connected to the common electrode 40. The second LED contacts 52 of the first LEDs 31 are at least indirectly electrically connected to the first electrode 41 and the second LED contacts 52 of the second LEDs 32 are at least indirectly electrically connected to the second electrode 42 so that the first LEDs 31 are electrically connected in parallel and the second LEDs 32 are electrically connected in parallel. The first and second LEDs 31, 32 share the common electrode 40. The common electrode 40 can, for example, be connected to a common power or ground voltage. The first and second electrodes 41, 42 can also individually provide a power or ground signal, for example under the control of an external controller (not shown), to control the LEDs 30 to emit light.

In some embodiments, and as also shown in FIG. 1A, a third electrode 43 is formed on or over the side of the component substrate 20 and a third plurality of third LEDs 33 is disposed on, in, or over the side of the component substrate 20. Each third LED 33 includes first and second LED contacts 51, 52 for providing power to the third LED 33 to cause the third LED 33 to emit light. As with the first and second LEDs 31, 32, the first LED contacts 51 of the third LEDs 33 are at least indirectly electrically connected to the common electrode 40 and the second LED contacts 52 of the third LEDs 33 are at least indirectly electrically connected to the third electrode 43. As used herein, the term "at least an indirect electrical connection" can include a direct electrical connection by a wire or other electrical conductor or an electrical connection through an electrical component, for example a resistor, other passive electrical device, or a circuit such as an active control circuit.

A component substrate 20 can be any of a variety of substrates, for example, as are found in the display or lighting industry, including, but not limited to, glass, plastic, semiconductor, ceramic, metal, or composite (e.g., glass and semiconductor) substrates, and can include multiple layers, on or in one of which the various electrodes and LEDs 30 can be provided. The component substrate 20 can be substantially transparent, for example having a transparency greater than 50%, 70%, 80% 90%, or 95%. The common, first, second, and third (if present) electrodes 40, 41, 42, (and if present) 43 can be any patterned electrical conductor, for example, patterned metal, metal alloys, metal oxides, conductive inks, or the like, and can be made using photolithographic or inkjet methods, for example. The first and second LEDs 31, 32 (LEDs 30) can be made in a doped or undoped semiconductor or compound semiconductor in one or more layers using photolithographic materials and methods. The LEDs 30 can be horizontal LEDs 30 (as shown in FIG. 1B) or vertical LEDs 30 (not shown) and can be disposed on the component substrate 20 using pick-and-place or surface mount methods. In some embodiments of the present invention, LEDs 30 are micro-transfer printed from an LED source wafer onto a component substrate 20 using an elastomeric stamp that fractures one or more tethers connecting each LEDs 30 to the LED source wafer so that the micro-transfer printed LEDs 30 include a broken tether 60 (e.g., at least a portion of a tether).

A multi-LED component 10 can include common, first, second, and optionally third electrically conductive bond pads 22 on the component substrate 20 electrically connected to the common, first, second, and optional third electrodes 40, 41, 42, 43, respectively. Bond pads 22 are electrically conductive connection pads that provide a location for electrically connecting a common, first, and second electrodes 40, 41, 42 to an external circuit such as a controller (not shown in FIG. 1A), for example, that provides power, ground or control signals to the multi-LED component 10. A variety of physical connections can be made to bond pads 22, such as wire bond connections, solder connections, flip-chip connections, and the like and as are known in the integrated circuit and electronic device assembly arts. Bond pads 22 can be specially defined electrical conductors electrically connected to a corresponding electrode, designated portions of the corresponding electrode, or portions of an appropriately connected wire 24 (for example, as shown in FIGS. 3A-5B).

In some embodiments of a multi-LED component 10 in accordance with the present invention, first LEDs 31 emit light of a first color and second LEDs 32 emit light of a second color different from the first color. For example, the first LEDs 31 can be blue LEDs that emit blue light and the second LEDs 32 can be yellow LEDs that emit yellow light. Different LEDs 30 of a multi-LED component 10 can be controlled separately to emit colored light or together to emit light that is perceived by the human visual system as white light. In some embodiments, an LED 30 can emit white light, for example including a blue-light emitter in combination with a color-converting material (e.g., a phosphor or quantum dot) that converts blue light to yellow light so that the blue and yellow light together from the LED 30 are perceived as white light. In some embodiments, a plurality of color-converting materials (e.g., quantum dots) are used in combination with a certain color LED to produce light perceived as white. For example, red and green, and optionally yellow, quantum dots can be used with a blue LED to produce light perceived as white. Moreover, a multi-LED component 10 that has first, second, and third LEDs 31, 32, 33 can emit light that in combination appears white to an observer, for example the human visual system. The first LEDs 31 can emit light of a first color, the second LEDs 32 can emit light of a second color different from the first color, and the third LEDs 33 can emit light of a third color different from the first color and different from the second color. For example, the first LED 31 can be a red LED that emits red light, the second LED 32 can be a green LED that emits green light, and the third LED 33 can be a blue LED that emits blue light.

A plurality of first LEDs 31 can include five or more first LEDs 31, ten or more first LEDs 31, twenty or more first LEDs 31, fifty or more first LEDs 31, or one hundred or more first LEDs 31. A plurality of second LEDs 32 can include five or more second LEDs 32, ten or more second LEDs 32, twenty or more second LEDs 32, fifty or more second LEDs 32, or one hundred or more second LEDs 32. A plurality of third LEDs 33, if present, can include five or more third LEDs 33, ten or more third LEDs 33, twenty or more third LEDs 33, fifty or more third LEDs 33, or one hundred or more third LEDs 33. In some embodiments, the number of first LEDs 31 is different from the number of second LEDs 32, the number of first LEDs 31 is different from the number of third LEDs 33, or the number of second LEDs 32 is different from the number of third LEDs 33 (not shown in FIG. 1A). By providing different numbers of LEDs 30 that emit different colors of light, the white point of the multi-LED component 10 can be controlled.

Figure 2:
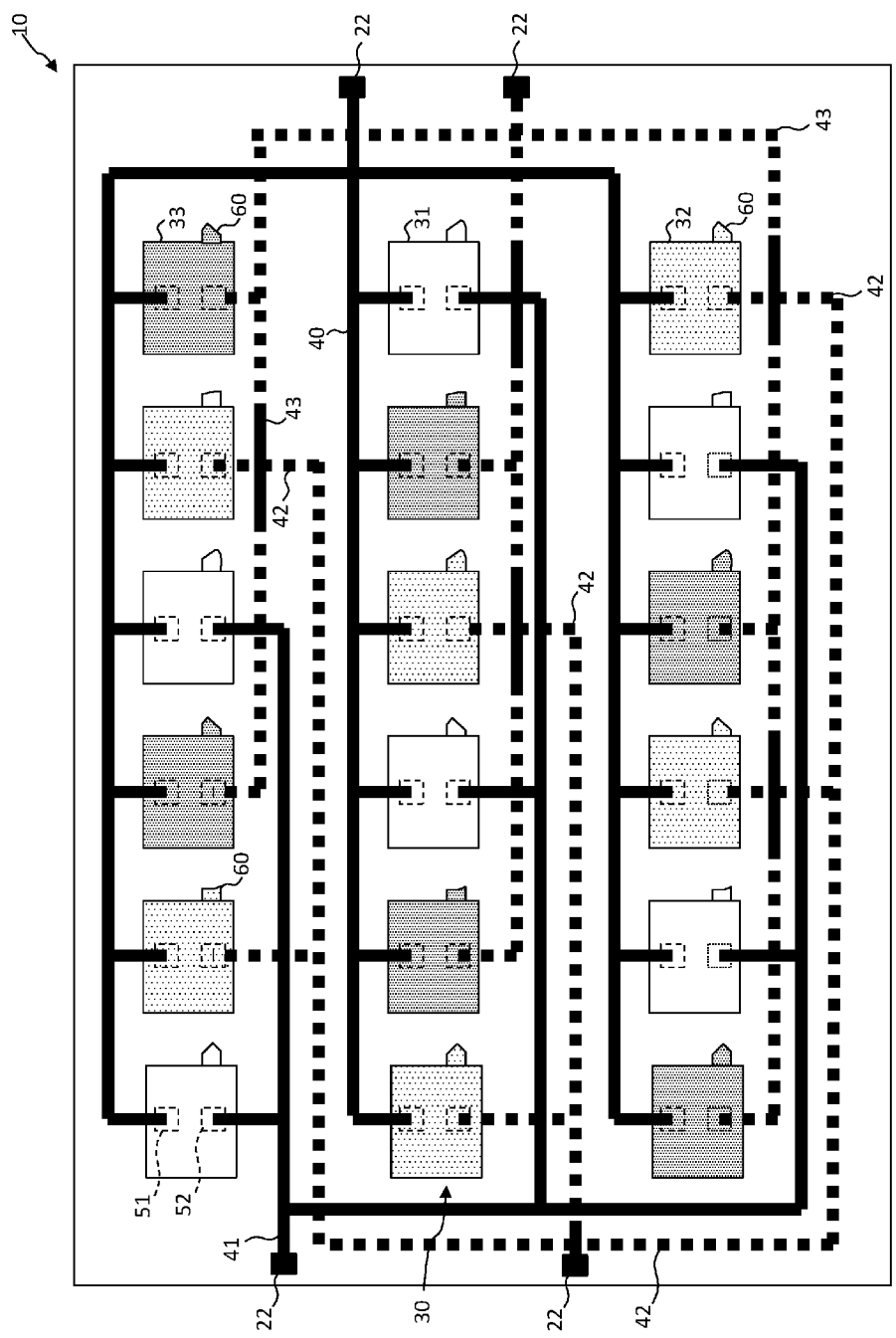
FIG. 2 is a schematic plan view of a multi-LED component according to illustrative embodiments of the present invention.

Referring to FIG. 2, in some embodiments, at least one of the first LEDs 31 in a multi-LED component 10 is disposed between two or more of the second LEDs 32 in the multi-LED component 10. If the multi-LED component 10 includes third LEDs 33, at least one of the third LEDs 33 is disposed closer to a first LED 31 and closer to a second LED 32 than to another third LED 33. By spatially interleaving first and second LEDs 31, 32, (and third LEDs 33 if present), different colors of light emitted by the first and second LEDs 31, 32 are spatially mixed so that the human visual system perceives the combined colors as a single color, such as white. In some such embodiments, the common, first, second, and third electrodes 40, 41, 42, 43 connected to the first and second LED contacts 51, 52 of the LEDs 30 are formed on multiple layers on the component substrate 20, as shown by the dashed lines (representing patterned conductors in one layer) and the solid lines (representing patterned conductors in another layer). Electrical connections can be made between the layers using vias (not shown) as is commonly practiced in the integrated circuit and printed circuit board industries. Bond pads 22 can be located in the same exposed level.

Figure 3A:
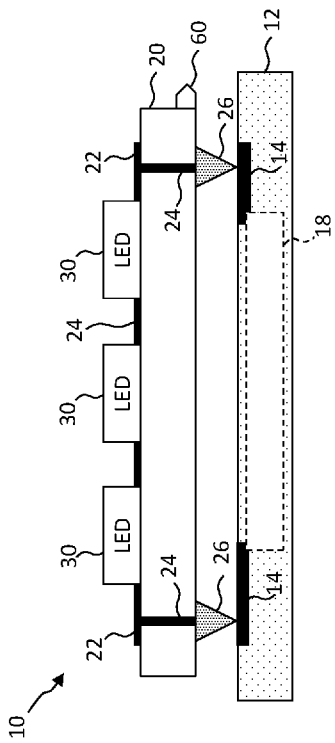
FIGS. 3A and 3B are a schematic cross section and corresponding plan view of a multi-LED component and a system substrate according to illustrative embodiments of the present invention.
Figure 3B:
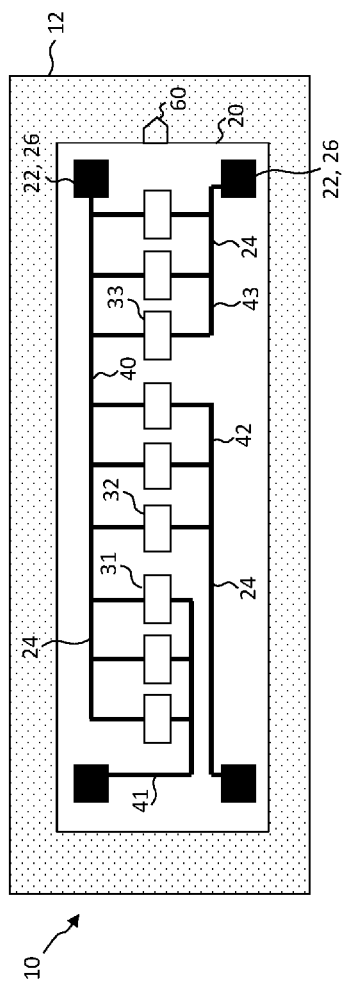

Referring to FIGS. 3A and 3B, in some embodiments, a multi-LED component 10 is a micro-transfer printable element having a broken tether 60. Moreover, as shown in FIGS. 3A, 4A, 5A, and 5B, a multi-LED component 10 can include connection posts 26 that can make electrical connections between the multi-LED component 10 and contact pads 14 on a destination system substrate 12, for example with wires 24 formed in through-silicon vias. As illustrated in FIG. 3B, a common connection post 26 can be connected to the common electrode 40, a first connection post 26 can be connected to the first electrode 41, a second connection post 26 can be connected to the second electrode 42, and a third connection post 26 can be connected to the third electrode 43. The contact pads 14 are provided on the system substrate 12 to provide an electrical connection between the common, first, second, and third electrodes 40, 41, 42, 43 and a circuit 18, for example a control circuit or connection circuit to an external or remote control circuit. Connection posts 26 can be electrically connected to contact pads 14 during the process of micro-transfer printing, as is discussed in more detail in U.S. Patent Application No. 62/303,096, the disclosure of which is incorporated herein by reference in its entirety. In some embodiments, multi-LED components 10 are micro-transfer printed without connection posts 26 and are interconnected using photolithographic methods and materials, for example using bond pads 22 provided on the component substrate 20 or system substrate 12 (for example corresponding to the contact pads 14). In some embodiments, pick-and-place or surface-mount technology methods are used to locate a multi-LED component 10 on a system substrate 12. Bond pads 22 can be used to enable electrical connections between a component substrate 20 and a system substrate 12, for example using wire bonds, flip chip methods, or photolithographic methods known in the art. In any of these cases, an adhesive can be disposed between a system substrate 12 and a component substrate 20 to adhere the system substrate 12 to the component substrate 20.

In some embodiments, multiple multi-LED components 10 are disposed on a system substrate 12. Multiple multi-LED components 10 (e.g., on a single substrate) can be controlled separately or together, individually or as a unit.

In some embodiments, LEDs 30 include connection posts 26 (not shown) and are electrically connected through contact pads 14 on a component substrate 20 to the common, first, and second electrodes 40, 41, 42 through micro-transfer printing. In some embodiments, LEDs 30 are electrically connected on the component substrate 20 using photolithographic methods and materials.

In some embodiments, one or more control circuits 18 are provided in or on a system substrate 12. In some embodiments, one or more control circuits 18 are provided external to a system substrate 12 (e.g., not on the system substrate 12) (not shown). Circuits 18 can be disposed in integrated circuits (for example micro-transfer printed integrated circuits) on a system substrate 12, formed in or on the system substrate 12 (e.g., if the system substrate 12 is or includes semiconductor materials), or found in external integrated circuits or controllers. In various embodiments, a system substrate 12 can be a display, a lighting substrate, or a printed circuit board.

Figure 4A:
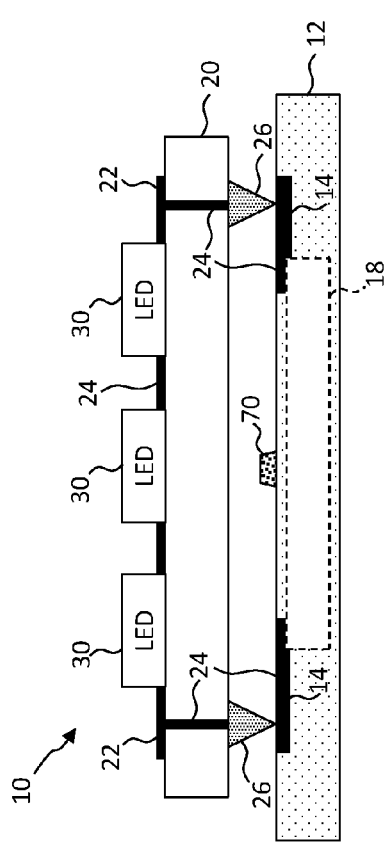
FIGS. 4A-4C are different schematic cross sections of a multi-LED component and a system substrate with a photo-sensor according to illustrative embodiments of the present invention.
Figure 4B:
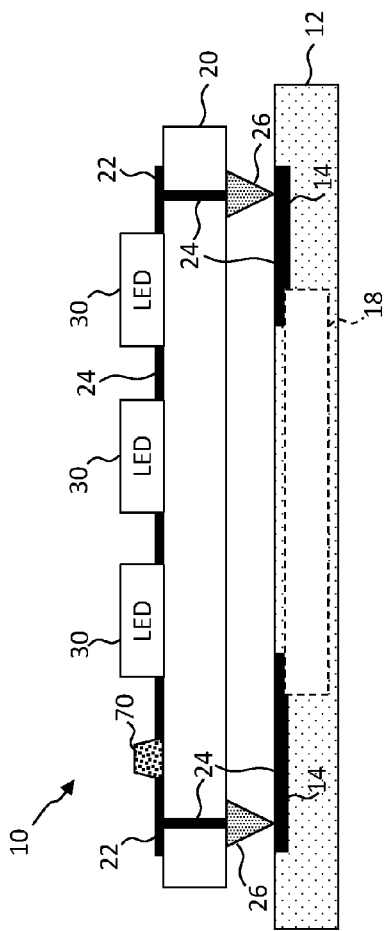
Figure 4C:
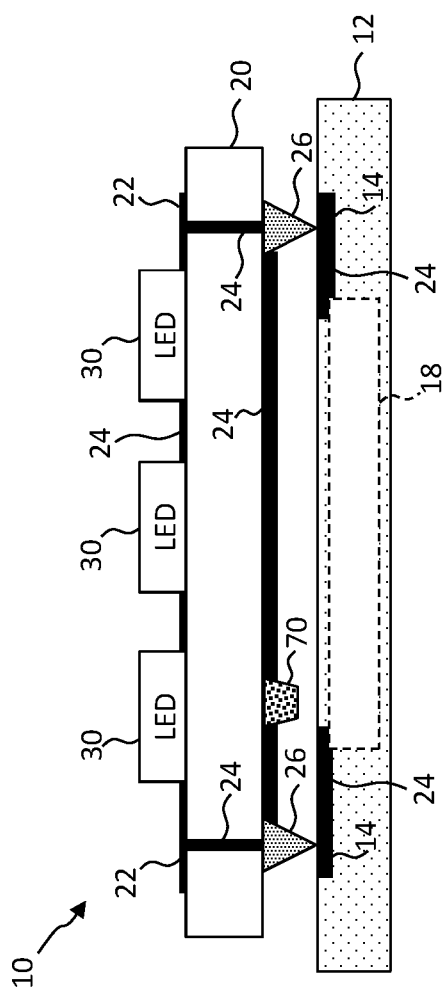

Referring next to FIGS. 4A-4C, in some embodiments of the present invention, a multi-LED component 10 includes one or more photo-sensors 70 sensitive to the light emitted by any combination of LEDs 30 disposed thereon (e.g., first, second, or third LEDs (if present) 31, 32, 33, FIG. 3B). Photo-sensors 70 optionally include color filters or an infra-red blocking filter and can be tuned to be sensitive to a desired color, to white light, or to ambient light. In FIGS. 4A-4C, the LEDs 30 are on a side of the component substrate 20 opposite the system substrate 12. In some embodiments, a photo-sensor 70 is disposed on a side of a component substrate 20 opposite LEDs 30, for example on a system substrate 12 and between the system substrate 12 and the component substrate 20 (as shown in FIG. 4A), on a side of the system substrate 12 opposite the component substrate 20 (not shown), or on the component substrate 20 between the system substrate 12 and the component substrate 20 (as shown in FIG. 4C). In some embodiments, a photo-sensor 70 can be located on the same side of a component substrate 20 as the LEDs 30 and opposite a system substrate 12 (as shown in FIG. 4B).

In some embodiments, as shown in FIGS. 5A-5B, the photo-sensor 70 can be located between the system substrate 12 and the component substrate 20 and disposed on the system substrate 12 (FIG. 5A) or on the component substrate 20 (FIG. 5B). Referring to FIG. 5B, the LEDs 30 are on a side of a component substrate 20 adjacent to a system substrate 12. In some embodiments, photo-sensor 70 is located on a side of the component substrate 20 opposite the system substrate 12 (not shown in FIGS. 5A and 5B) or on a side of the system substrate 12 opposite the component substrate 20 (not shown in FIGS. 5A and 5B).

In all of these arrangements, one or more photo-sensors 70 are disposed to be responsive to light emitted from LEDs 30, to one or more LEDs 30, or to ambient light. The light can be transmitted to the one or more photo-sensors 70 through the atmosphere externally to the multi-LED component 10, through the component substrate 20, through the system substrate 12, through adhesives provided between the system substrate 12 and the component substrate 20, or through the space between the system substrate 12 and the component substrate 20. The component substrates 20 including photo-sensors 70 can also include connection posts 26 (as shown), or not (not shown). Photo-sensors 70 can be silicon photo-diodes electrically connected with photolithographically defined wires 24 and can have a substrate separate from the system substrate 12 or the component substrate 20 or can be made in or on the system substrate 12 or the component substrate 20, for example if the system substrate 12 or the component substrate 20 includes or comprises semiconductor materials. By using photo-sensors 70, a multi-LED component 10 in accordance with some embodiments of the present invention can be controlled to provide the desired amount or color of light in the presence of ambient light and or compensate for varying amounts of emitted light of different colors from the multi-LED component 10.

Figure 6:
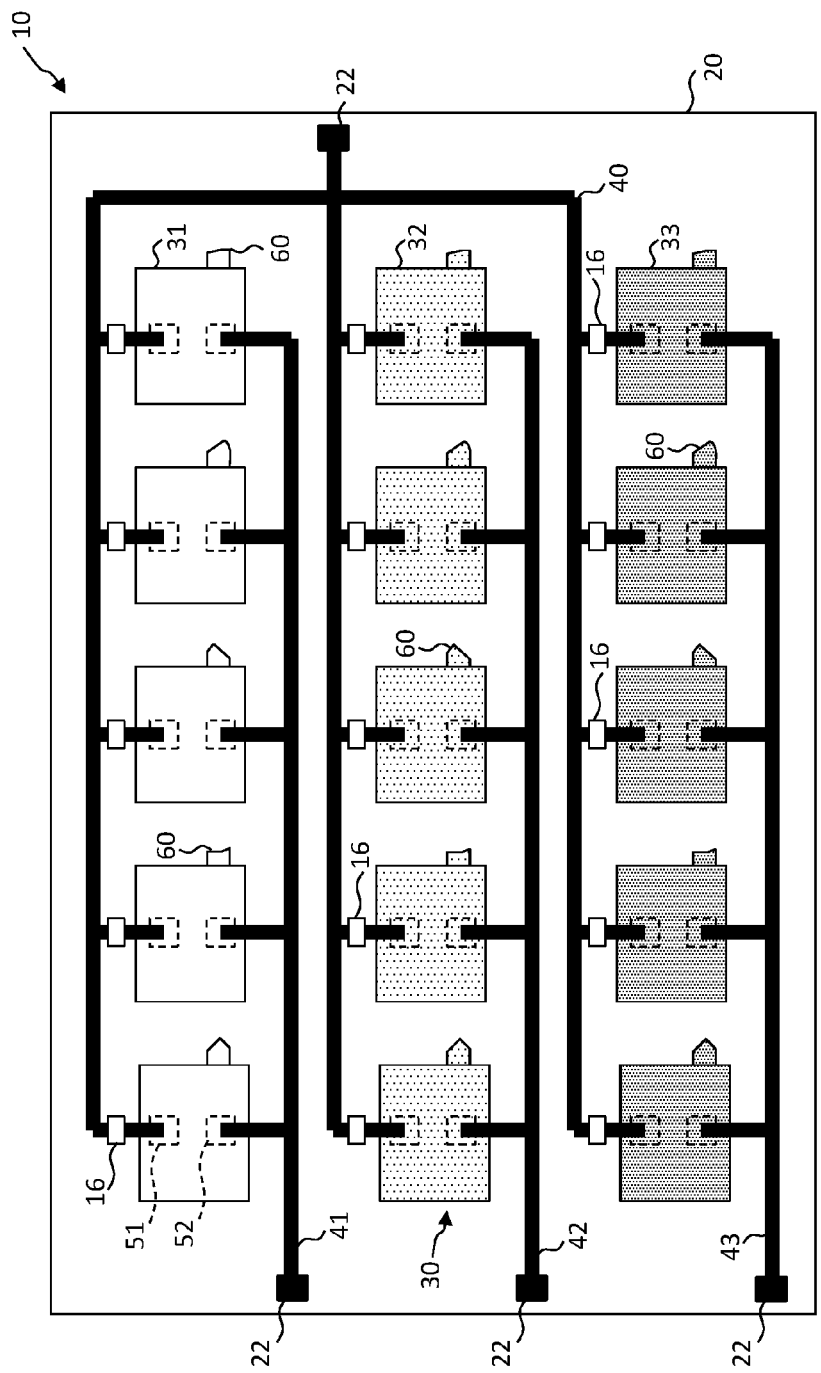
FIGS. 6-8 are schematic plan views of multi-LED components having fuses according to illustrative embodiments of the present invention.
Figure 7:
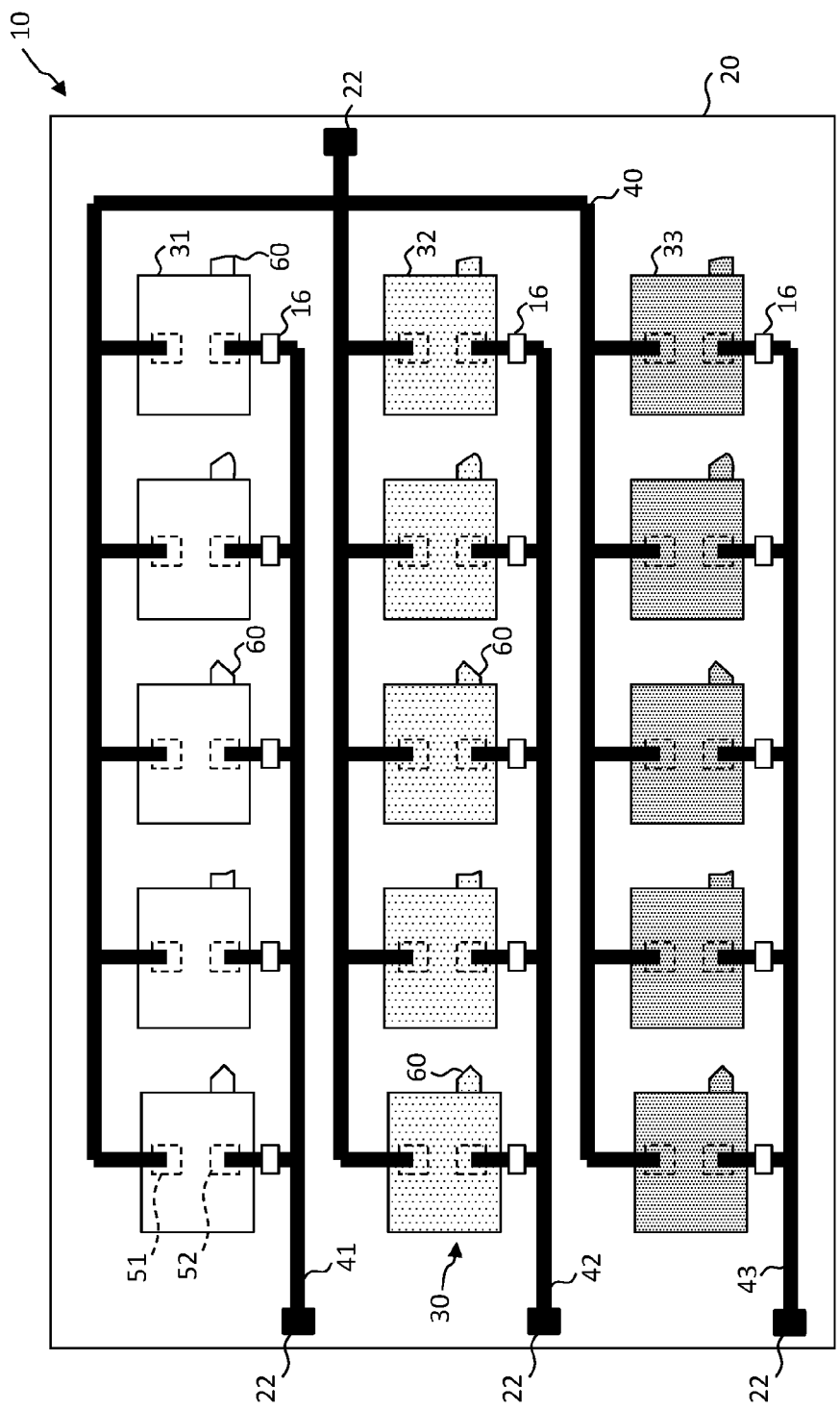

In some embodiments of the present invention, a multi-LED component 10 comprises a fuse 16 electrically connected in series with one or more of the LEDs 30, all of the LEDs 30, or each LED 30. Referring to the illustrative embodiments illustrated in FIG. 6, fuse 16 is electrically connected between each first LED contact 51 and the common electrode 40 for all of the LEDs 30. Referring to the illustrative embodiments illustrated in FIG. 7, a fuse 16 is electrically connected in series between each second LED contact 52 of the first LEDs 31 and the first electrode 41, between each second LED contact 52 of the second LEDs 32 and the second electrode 42, or between each second LED contact 52 of the third LEDs 33 and the third electrode 43. In some embodiments, a fuse is connected in series between at least one of each second LED contact 52 of the first LEDs 31 and the first electrode 41, each second LED contact 52 of the second LEDs 32 and the second electrode 42, and (if present) each second LED contact 52 of the third LEDs 33 and the third electrode 43

Figure 8:
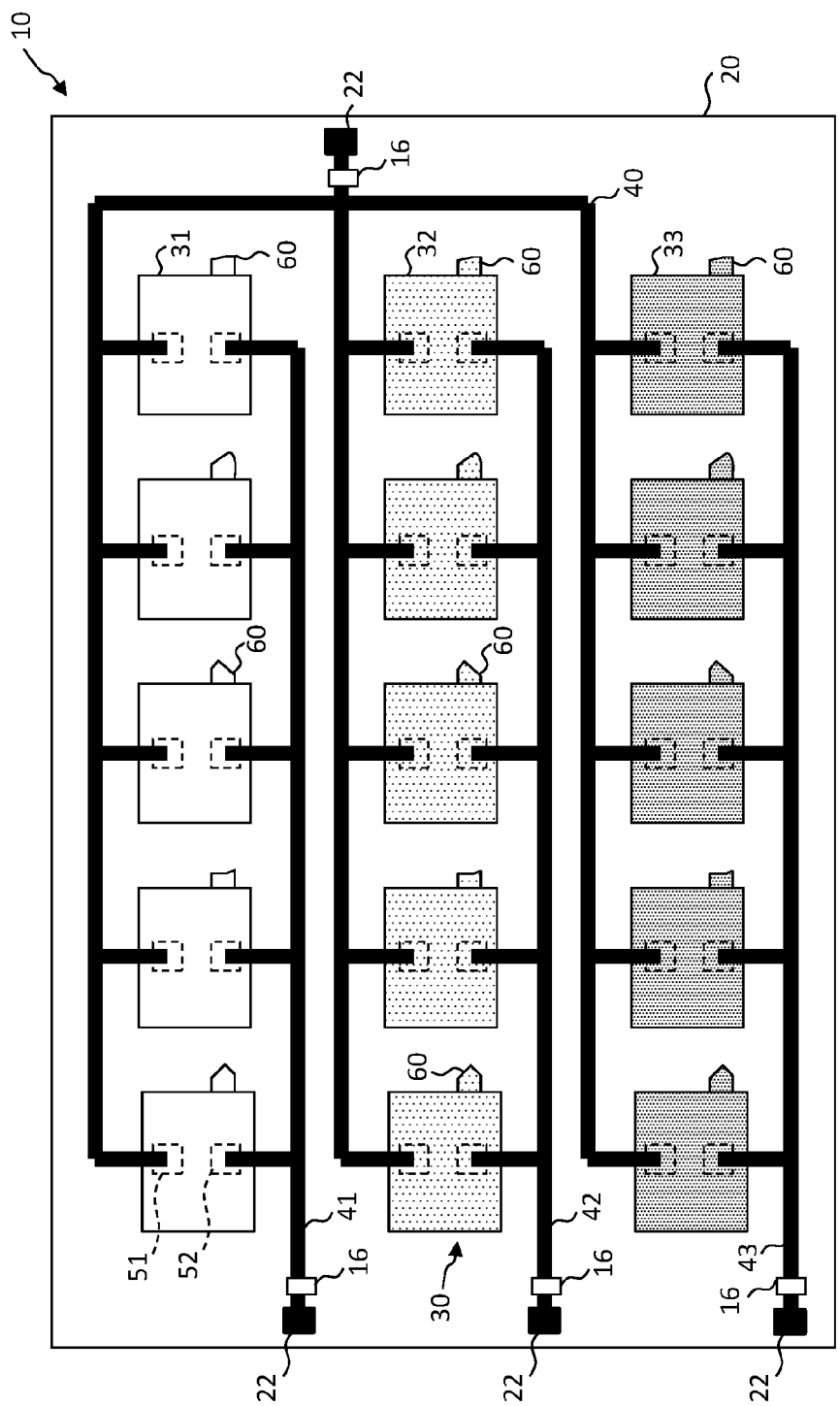

In some embodiments, as shown in FIG. 8, each of the common, first, second, and third electrodes 40, 41, 42, 43 has a corresponding common, first, second, and third bond pad 22 (e.g., an electrical connection pad) to which external electrical connections can be made. In some embodiments, at least one bond pad 22 is connected electrically in parallel to all of the LEDs 30 (in the case of the common electrode 40 bond pad 22), to all of the first LEDs 31 (for the case of the first electrode 41 bond pad 22), to all of the second LEDs 32 (for the case of the second electrode 42 bond pad 22)), or to all of the third LEDs 33 (for the case of the third electrode 43 bond pad 22 where the third LEDs 33 and third electrode 43 are present). In some embodiments, a fuse 16 is electrically connected in series between at least one of the common electrode 40 and the corresponding bond pad 22 of the common electrode 40, the first electrode 41 and the bond pad 22 of the first electrode 41, the second electrode 42 and the bond pad 22 of the second electrode 42, and (if present) the third electrode 43 and the bond pad 22 of the third electrode 43. In some embodiments, only the fuse 16 electrically connected in series with the common electrode 40 is provided. In some embodiments, fuses 16 are electrically connected to all of the first, second, and third (if present) electrodes 41, 42, 43 but not the common electrode 40.

In some embodiments, fuses 16 are provided to protect the multi-LED component 10 from defective or dysfunctional LEDs 30 that, for example, conduct too much electrical current. If an LED 30 conducts too much electrical current, an electrically connected fuse 16 will blow (become non-conductive by ceasing to conduct electricity, for example by vaporizing a thin, resistive electrical conductor or wire). In a multi-LED component 10 in accordance with some embodiments of the present invention, a blown fuse 16 will not prevent the entire multi-LED component 10 from functioning but will, because of the plurality of LEDs 30, simply emit less light and, possibly, light that together appears to be of a slightly different color (e.g., having a shifted color temperature). The relative magnitude of the light emission change will depend at least partly on the number of LEDs 30 in a multi-LED component 10. Multi-LED components 10 with larger numbers of LEDs 30 will exhibit less color change in the presence of the same number of electrically shorted LEDs 30 and blown fuses 16 as multi-LED components 10 with smaller numbers of LEDs 30.

Multi-LED component 10 is operated to emit light by providing electrical power to the common, first, second, and third (if present) electrodes 40, 41, 42, 43 from, for example, a controller (no shown). Electrical current passes through the fuses 16 (if present) and the LEDs 30, causing the LEDs 30 to emit light. A multi-LED component 10 can be an illumination device or a portion of a display and can be mounted in a luminaire or on a display substrate.

Figure 9:
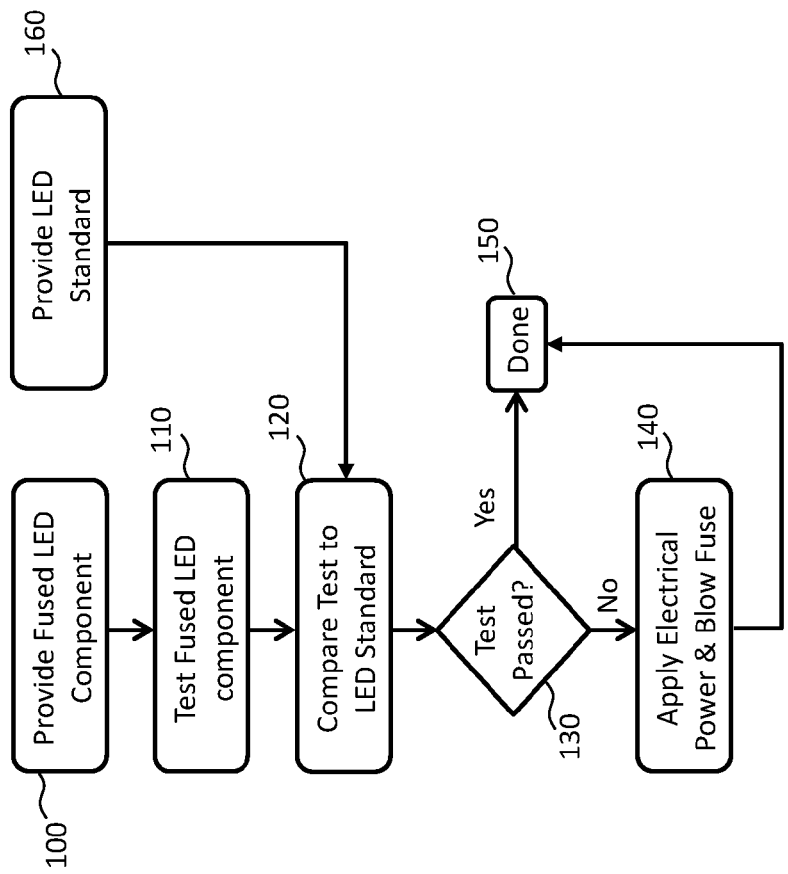
FIG. 9 is a flow diagram illustrating illustrative methods in accordance with certain embodiments of the present invention.

Referring to FIG. 9, an exemplary method of using a multi-LED component 10 includes providing a multi-LED component 10 having a fuse 16 electrically connected in series with a defective LED 30 in step 100 and applying electrical power to the common electrode 40 and first or second electrodes 41, 42 in step 140 so that the fuse 16 associated with the defective LED 30 is rendered non-conductive.

In some embodiments, a method of use comprises the following steps. A multi-LED component 10 with fuses 16 is tested in step 110 by applying electrical power to the multi-LED component 10, for example from a power supply electrically connected across the common and first, second, or (if present) third electrodes 40, 41, 42, 43. An LED light emission or electrical performance standard is provided in step 160. The performance standard can be any one of a variety of light output or electrical standards, for example a light-emission efficiency in response to current standard, a light-emission color standard, a maximum light output standard, or a maximum current standard. Test results are compared to the chosen LED standard in step 120 and a determination as to whether the test is passed is made in step 130. If the test is passed, the multi-LED component 10 is determined to be a good multi-LED component 10 and the process is done in step 150. If the test is failed, for any of a variety of reasons, including, but not limited to, an electrically shorted LED 30, the multi-LED component 10 is determined to be defective and the fuse 16 is blown in step 140 by applying sufficient electrical power across the common electrode 40 and the electrode associated with the failed test (e.g., one or more of the first, second, or third, if present, LEDs 31, 32, 33) to blow the associated fuse 16 and render it non-conductive [for example, by melting a resistive fuse wire in the fuse 16 with electrical current, for example by applying sufficient electrical power to the corresponding electrodes in a forward-biased direction or in a reverse-biased direction (but at a voltage less than the breakdown voltage of the LED 30)].

In some embodiments, steps 110, 120, 130, and 140 are performed in a single step by applying reverse-biased current sufficient to blow the fuse 16 of defective LEDs 30. If an LED 30 is shorted, it can conduct reverse-biased current that blows the fuse 16. If an LED 30 is not shorted, it does not conduct reverse-biased current that blows the fuse 16. Alternatively or in addition, a forward-biased current can be employed that is greater than an operational current of the LED 30 and has sufficient current to blow the fuse 16 but not damage the LED 30. All of the LEDs 30 connected to the same electrode in a multi-LED component 10 can be tested together as described, for example, by providing electrical power to the same electrode.

Certain embodiments of the present invention can be made by providing a component substrate 20, forming electrodes (e.g., common, first, second, and third electrodes 40, 41, 42, 43), contact pads 14, and bond pads 22 on the component substrate 20 using photolithographic techniques, and micro-transfer printing LEDs 30 having connection posts 26 onto the component substrate 20. In some embodiments, LEDs 30 are micro-transfer printed onto a component substrate 20, adhered to the component substrate 20, and electrical conductors (e.g., common, first, second, and third electrodes 40, 41, 42, 43 and bond pads 22) are made using photolithographic methods and materials (i.e., rather than with connection posts 26). LEDs 30 can be made using conventional integrated circuit methods and can be provided (if desired) with integrated fuses 16 or, for example, fuses 16 can be made as part of one or more photolithographic patterning steps or micro-transfer printed from a fuse source wafer.

In some embodiments of the present invention, a system substrate 12 is provided with contact pads 14 and a component substrate 20 is micro-transfer printed with connection posts 26 onto the contact pads 14 of the system substrate 12. In some embodiments, a component substrate 20 is micro-transfer printed onto and adhered to a system substrate 12. In some embodiments, other pick-and-place or surface mount methods can be used to dispose a multi-LED components 10 on a system substrate 12. In some embodiments, the common, first, second, and third (if present) electrodes 40, 41, 42, 43 are electrically connected using photolithographic methods and materials or using wire bonding from bond pads 22 on a component substrate 20 to contact pads 14 on a system substrate 12.

Light-emitting diodes 30 can be inorganic light-emitting diodes made in a semiconductor material, such as a compound semiconductor (e.g., GaN). The semiconductor material can be crystalline. Any one or each of the LEDs 30 or the fuses 16 can have at least one of a width from 2 to 5 μm, 5 to 10 μm, 10 to 20 μm, or 20 to 50 μm, a length from 2 to 5 μm, 5 to 10 μm, 10 to 20 μm, or 20 to 50 μm, and a height from 2 to 5 μm, 4 to 10 μm, 10 to 20 μm, or 20 to 50 μm.

Common, first, second, or third electrodes 40, 41, 42, 43, contact pads 14, bond pads 22, or wires 24 can be patterned electrically conductive metal conductors, wires, or areas formed, or disposed on, a component substrate 20 and can be made using, for example, photolithographic methods, tools, and materials. Alternatively, inkjet tools and materials can be used, for example, with conductive inks including conductive particles.

A fuse 16 is an electrically conductive element that becomes permanently non-conductive when a pre-determined current passes through the fuse 16 and, as such, is a type of sacrificial low-resistance resistor providing overcurrent protection. A fuse 16 can include a fuse wire having a predetermined electrical resistance and current-carrying capacity that is exceeded when an electrical current passes through a defective LED 30. An essential component of a fuse 16 in accordance with some embodiments of the present invention is a low-resistance electrical conductor (e.g., fuse wire) that melts, oxidizes, vaporizes, sublimates, reacts, or otherwise loses conductivity when too much current flows through the fuse 16, referred to herein generically as "melting," although fuses 16 in accordance with embodiments of the present invention are not limited strictly to fuses 16 that melt. A fuse 16 can have a melting temperature that is greater than the maximum rated operating temperature of an LED 30. According to some embodiments of the present invention, a fuse 16 includes a metal fuse wire or strip. As used herein, a fuse 16 that is rendered non-conductive is referred to as a "blown" fuse 16 and the process of rendering the fuse 16 non-conductive is the process of "blowing" the fuse 16.

The current at which a fuse 16 is blown is its rated current or current rating (used interchangeably). In some embodiments, the rated current is greater than or equal to 2 times, 5 times, 10 times, 20 times, 50 times, 100 times, 500 times, or 1000 times the maximum desired LED 30 current.

A fuse wire in each fuse 16 can be metal wires formed in a pre-determined shape and size, such as a shape and size providing a cross section designed to melt when conducting a desired current. A fuse 16 or fuse wire can be made, for example, of a metal such as zinc, copper, silver, aluminum, nickel, chrome, or tin, or metal alloys such as nickel-chromium that include these or other metals. In some embodiments, fuses 16 or fuse wires are made of most degenerate semiconductors that are highly doped and conduct current in a manner similar to a native metal. Fuses 16 or fuse wires can be made of or in a semiconductor and can be polysilicon. In some embodiments, a fuse wire has a different cross section but is made of the same materials as wires 24 or a common, first, second, or third electrode 40, 41, 42, 43. Fuse 16 or a fuse wire can have a cross section that is small or smaller than the cross section of other electrical conductors with which the fuse 16 is electrically connected in series, such as the wires 24 or common, first, second, or third electrodes 40, 41, 42, 43. A fuse wire can be a joint between two other electrical conductors. If an LED 30 is too conductive (i.e., shorted), for example, if the LED 30 has an electrical short or short circuit (whether or not the LED 30 emits any light, too much light, too little light, or no light), a connected fuse 16 can cease to conduct any current at all when an excess of current is supplied to the shorted LED 30 in an amount sufficient to blow the fuse 16. The term 'shorted' or 'short' refers to an electrical short circuit in a component, in this case an LED 30 in a multi-LED component 10. A multi-LED component 10 having a shorted LED 30 is referred to herein as a shorted multi-LED component 10.

Furthermore, each of the different fuses 16 in a multi-LED component 10 can have a different optimal or maximum desired current. Fuses 16 can be customized to a particular LED 30, group of LEDs 30, or LED technology with which it is electrically in series (e.g., LED compound semiconductor). Likewise, fuses 16 in one multi-LED component 10 can be different from fuses 16 in another multi-LED component 10 (e.g., disposed on the same system substrate 12). LEDs 30 can be different, for example, emitting different colors of light or have different fuses 16, for example, blowing responsive to different amounts of electrical current, voltage, or power.

In an exemplary method in accordance with certain embodiments of the present invention, an LED source wafer comprising LEDs (with or without integrated fuses 16) and a plurality of connection posts 26 is made by providing a component wafer. A sacrificial layer is patterned in, on, or over the component wafer to form sacrificial portions separated by portions of the component wafer forming anchors using photolithographic materials and methods. The component wafer comprises a substrate comprising at least one of, for example, a semiconductor, a glass, a polymer, a metal, and a ceramic. Connection post forms are etched into sacrificial portions and an LED 30 is provided by forming or disposing an LED 30 entirely on the sacrificial portion. The LED 30 has first and second LED contacts 51, 52 for providing power to the LED 30 to cause the LED 30 to emit light.

Continuing on in the exemplary method, a patterned dielectric layer is formed or otherwise disposed on the LED 30 to protect the LED 30 and provide first and second LED contacts 51, 52. Electrical conductors, such as wires 24, are formed in electrical contact with the first and second LED contacts 51, 52 over the sacrificial portion and the connection post form to make first and second connection posts 26 and first and second LED contacts 51, 52. The patterned dielectric layer can be, for example, silicon dioxide and the electrical conducting wires 24 can be metal deposited and patterned using photolithographic materials, tools, and methods such as coating, sputtering, or evaporation, and etching with patterned photoresist.

Continuing on in the exemplary method, a fuse 16 is disposed entirely in, on, or over the sacrificial portion. In some embodiments, the fuse 16 is formed on the sacrificial portions of the component wafer using photolithographic processes and materials and can be made, partially or entirely, in a common step with the wires 24, common, first, second, or (if present) third electrodes 40, 41, 42, (and if present) 43, or first and second LED contacts 51, 52 and using the same materials or including at least some of the same materials. Similarly, common, first, second, or third electrodes 40, 41, 42, 43 or portions of the common, first, second, or third electrodes 40, 41, 42, 43 can be formed in a common step with the wires 24 or first and second LED contacts 51, 52 and using the same materials or including at least some of the same materials. In some embodiments, the fuse 16 is provided by micro-transfer printing the fuse 16 from a fuse source wafer. If either or both of an LED 30 and a corresponding fuse 16 are micro-transfer printed, they can have connection posts 26 to enable electrical connections in, on, or over a component substrate 20 on or over which they are disposed. A fuse wire can be made with a desired cross section together with a portion of the portion of the first and second LED contacts 51, 52, portions of the common, first, second, or third electrodes 40, 41, 42, 43, or common, first, second, or third connection posts 26. In a following step of the exemplary method, additional material can be provided to the portion of the first and second LED contacts 51, 52, portions of the common, first, second, or third electrodes 40, 41, 42, 43, or common, first, second, or third connection posts 26 to increase their cross section and electrical conductivity compared to the fuse 16 (or a fuse wire thereof). An optional encapsulation layer is provided over the LED 30, wires 24, and fuse 16.

Continuing on in the exemplary method, the sacrificial portion can be etched to form one or more tethers connecting the LED 30 to the anchor and a between the LED 30 and the component wafer of the LED source wafer, enabling the LEDs 30 to be micro-transfer printed with a transfer stamp. The sacrificial portions can be, for example, an oxide layer or a designated anisotropically etchable portion of the component wafer or, once etched, the gap between the LED 30 and the LED source wafer. In some embodiments, the optional encapsulation layer is patterned and can include an oxide or nitride such as silicon nitride and can form at least a portion of a tether that connects an LED 30 to an anchor. The LED source wafer can include a plurality of sacrificial portions and corresponding plurality of LEDs 30 disposed on or over the sacrificial portions.

In certain embodiments, an encapsulation layer and wires 24 provides sufficient mechanical and structural rigidity to the LED 30 that the LED 30 can be micro-transfer printed without additional support. In some embodiments, a sacrificial layer provides a surface with sufficient mechanical rigidity to enable LEDs 30 or fuses 16 to be micro-transfer printed onto or over the layer.

Shorted LEDs 30 can conduct more current than functional LEDs 30, for example when provided with a voltage difference that is less than the expected voltage drop for the LED 30 when provided with a reverse-biased voltage differential, or by noting a greater-than-expected current when driven with a predetermined operating voltage. In some embodiments, a shorted LED 30 is determined by passing a current through the shorted LEDs 30 and measuring the voltage across the LEDs 30. An electrical short can be measured as a very low voltage drop in comparison with a good LED 30, which can have a voltage drop exceeding, for example, two volts. For example, an electrical short can be measured as a voltage drop across the power supply lines (power and ground lines, e.g., common and first, second, or third electrodes 40, 41, 42, 43) of a shorted LED 30 of less than two volts, less than 1.5 volts, less than 1.0 volts, less than 0.5 volts, or less than 0.25 volts.

Fuses 16 connected to shorted LEDs 30 can be blown by providing a reverse-biased current across the shorted LEDs 30 with a voltage that is greater than the normal operating voltage but less than the breakdown voltage of the LEDs 30, to avoid destroying functional LEDs 30. In some embodiments, a shorted LED 30 can conduct enough current to drive the plurality of functional LEDs 30 in a multi-LED component 10. By selecting or setting a fuse 16 current rating at a current level greater than the current necessary to operate a single functional LED 30 but less than the current necessary to operate multiple LEDs 30 in a multi-LED component 10, a fuse 16 electrically connected to a shorted LED 30 can be blown by controlling the LEDs 30 to emit light from all of the other LEDs 30 in a multi-LED component 10.

The current rating of a fuse 16 can depend, at least in part, on the temperature of the fuse 16. Since an operational LED 30 can have an elevated temperature, the associated fuse 16 can also have an elevated temperature that affects its current rating. Hence, the spatial location of a fuse 16 with respect to a corresponding LED 30 (e.g., wherein each LED 30 is connected in serial to a single fuse 16) can be selected to reduce changes in the fuse 16 current rating due to temperature changes in the LED 30 (e.g., since greater spatial separation can reduce the influence of LED 30 temperature on fuse 16 temperature). A fuse 16 can be taken to be located a distance D from its associated LED 30. The associated LED 30 can be taken to have a length L and width W over a component substrate 20. In some embodiments, the distance D is greater than or equal to at least one of the length L and width W. In some embodiments, the distance D is greater than or equal to 1.5 times, 2 times, 3 times, 4 times, 5 times, 10 times, or 20 times at least one of the length L and width W. Without wishing to be bound by any particular theory, a distance D being greater than or equal to at least one of a length L and width W can reduce the influence of LED temperature on the fuse current rating. The rated current of a fuse 16 can be set to compensate for the operating temperature of, for example, an LED 30 or a multi-LED component 10.

As will be apparent to those skilled in the art of substrate and component layout, alternative arrangements of the LEDs 30 on the component substrate 20 and multi-LED components 10 on a system substrate 12 are possible.

In some embodiments of the present invention, LEDs 30, fuses 16, or multi-LED components 10 (collectively referred to below as elements) have a thin substrate with at least one of a thickness of only a few microns, for example, less than or equal to 25 microns, less than or equal to 15 microns, or less than or equal to 10 microns, and a width of 5-10 microns, 10-50 microns, 50-100 microns, or 100-1000 microns, and a length of 5-10 microns, 10-50 microns, 50-100 microns, or 100-1000 microns. Such micro-transfer printable elements can be made in a semiconductor source wafer (e.g., a silicon or GaN wafer) having a process side and a back side used to handle and transport the wafer. The elements can be formed using lithographic processes in an active layer on or in the process side of a source wafer. An empty release layer space (corresponding to sacrificial portion) can be formed beneath the micro-transfer printable elements with tethers connecting the micro-transfer printable elements to the source wafer in such a way that pressure applied against the micro-transfer printable elements with a transfer device (e.g., elastomeric stamp) breaks (e.g., fractures) the tethers to form a broken (e.g., fractured) tether 60 to release the micro-transfer printable elements from the source wafer. The elements are then micro-transfer printed to a destination substrate (component substrate 20 or system substrate 12). Lithographic processes in the integrated circuit art for forming micro-transfer printable elements in a source wafer, for example transistors, LEDS, wires, and capacitors, can be used. Equivalent etching and transfer process can be used to micro-transfer print assembled or constructed elements.

Methods of forming such micro-transfer printable structures are described, for example, in the paper "AMOLED Displays using Transfer-Printed Integrated Circuits" and U.S. Pat. No. 8,889,485. For a discussion of micro-transfer printing techniques, see U.S. Pat. Nos. 8,722,458, 7,622,367 and 8,506,867, the disclosure of each of which is hereby incorporated by reference herein in its entirety. Micro-transfer printing using compound micro-assembly structures and methods can also be used with the present invention, for example, as described in U.S. patent application Ser. No. 14/822,868, filed Aug. 10, 2015, entitled "Compound Micro-Assembly Strategies and Devices", the disclosure of which is hereby incorporated by reference in its entirety. In some embodiments, a multi-LED component 10 is a compound micro-assembled device.

Any source wafers having micro-transfer printable LEDs 30, fuses 16, or multi-LED components 10 thereon can be constructed or transfer printed from or both as part of a method in accordance with some embodiments of the present invention.

Connection posts 26 are electrical connections formed on a side of a micro-transfer printable element such as the LED 30, fuse 16, or multi-LED component 10 that extend generally perpendicular to a surface of the element. Such connection posts 26 can be formed from metals such as aluminum, titanium, tungsten, copper, silver, gold, or other conductive metals. In some embodiments, the connection posts 26 are made of one or more high elastic modulus metals, such as tungsten. As used herein, a high elastic modulus is an elastic modulus sufficient to maintain the function and structure of a connection post 26 when pressed into a system substrate 12 electrical contact pad 14.

Connection posts 26 can be formed by repeated masking and deposition processes that build up three-dimensional structures, for example, by etching one or more layers of metal evaporated or sputtered on the process side of the element. Such structures can also be made by forming a layer above the element surface (e.g., sacrificial layer), etching a well into the surface to form a connection post form, filling or covering it with a patterned conductive material such as metal, and then removing the layer. Connection posts 26 can have a variety of aspect ratios and typically have a peak area smaller than a base area and can have a sharp point for embedding in or piercing electrical contact pads 14. Connection posts 26 can include a post material coated with an electrically conductive material different from the post material. A post material can be, for example, an electrically conductive metal or a doped or undoped semiconductor or an electrically insulating polymer. For example, a post material can be a resin, cured, resin, or epoxy. A post material can have any of a variety of hardness or elastic modulus values. In some embodiments, a post material is softer than the conductive material so that the conductive material can crumple when the connection post 26 is under mechanical pressure. Alternatively, the conductive material is softer than the post material so that it deforms before the post material when under mechanical pressure. By deform is meant that the connection posts 26, the contact pads 14, or the conductive material change shape as a consequence of a transfer printing that physically contacts connection posts 26 to contact pads 14. Connection posts 26 or post material can be a semiconductor material, such as silicon or GaN, formed by etching material from around the connection post 26. Coatings, such as the conductive material can be evaporated or sputtered over the post material structure and then pattern-wise etched to form a connection post 26. The conductive material can be a solder or other metal or metal alloy that flows under a relatively low temperature, for example less than 120 degrees C. In particular, the conductive material can have a melting point less than the melting point of the post material.

In certain embodiments, contact pads 14 comprise a material that is softer than that of the connection posts 26. In other embodiments, connection posts 26 comprise a material that is softer than that of the contact pads 14. In some embodiments, a conductive material other than a material of a contact pad 14 or a connection post 26 adheres or electrically connects, or both, the contact pad 14 to the connection post 26. In certain embodiments, at least a portion of a contact pad 14 has a first conductive layer and a second conductive layer over the first conductive layer, and the second conductive layer has a lower melting temperature than the first conductive layer. In some embodiments, a contact pad 14 is coated with a non-conductive layer or the contact pad 14 is formed on a compliant non-conductive layer. In certain embodiments, a second conductive layer is a solder. In certain embodiments, a contact pad 14 is welded to a connection post 26. In certain embodiments, contact pads 14 are non-planar and connection posts 26 are inserted into the contact pads 14 (e.g., such that the shape of the connection posts 26 aligns with the non-planar shape of the contact pads).

System substrate 12 contact pads 14 can be made of or include a relatively soft metal, such as tin, solder, or tin-based solder, to assist in forming good electrical contact with connection posts 26 and adhesion with the elements. As used herein, a soft metal may refer to a metal into which a connection post 26 can be pressed to form an electrical connection between the connection post 26 and the contact pad 14. In some embodiments, a contact pad 14 can plastically deform and flow under mechanical pressure to provide a good electrical connection between the connection post 26 and the contact pad 14.

In some embodiments of the present invention, connection posts 26 can include a soft metal and the contact pads 14 can include a high elastic modulus metal. In some embodiments, connection posts 26 can plastically deform and flow under mechanical pressure to provide a good electrical connection between the connection post 26 and the contact pads 14.

An optional layer of adhesive can be disposed on or formed on a system substrate 12. If an optional layer of adhesive is disposed or formed on a system substrate 12, connection posts 26 can be driven through the adhesive layer to form an electrical connection with the contact pads 14 beneath the adhesive layer. The adhesive layer can be cured to more firmly adhere the element and maintain a robust electrical connection between the first and second connection posts 26 and contact pads 14 in the presence of mechanical stress. The adhesive layer can undergo some shrinkage during the curing process that can further strengthen the electrical connectivity and adhesion between the connection post 26 and the contact pads 14.

In some embodiments of the present invention, connection posts 26 are in contact with, are embedded in, or pierce contact pads 14 of an element. In some embodiments, either or both of one or more connection posts 26 and contact pads 14 are deformed or crumpled into a non-planar shape or are deformed so that the surfaces of the connection posts 26 and the contact pads 14 change shape on contact with each other. The deformation or crumpling can improve the electrical connection between the connection posts 26 and the contact pads 14 by increasing the surface area that is in contact between the connection posts 26 and the contact pads 14. To facilitate deformation, in some embodiments, connection posts 26 have a composition softer than that of contact pads 14 or contact pads 14 have a composition softer than connection posts 26.

In some embodiments, LEDs 30 or assemblies of such LEDs 30 formed in or disposed on a semiconductor wafer, for example gallium arsenide or silicon, can have a crystalline structure. Processing technologies for these materials typically employ high heat and reactive chemicals. However, by employing transfer technologies that do not stress the LEDs 30 or substrate materials, more benign environmental conditions can be used, for example, as compared to thin-film manufacturing processes. Thus, certain embodiments of the present invention have an advantage in that flexible substrates, such as polymeric substrates, that are intolerant of extreme processing conditions (e.g. heat, chemical, or mechanical processes) can be employed for a system substrate 12 or multi-LED components 10. Furthermore, it has been demonstrated that crystalline semiconductor substrates have strong mechanical properties and, in small sizes, can be relatively flexible and tolerant of mechanical stress. This is particularly true for certain substrates having 5-micron, 10-micron, 20-micron, 50-micron, or even 100-micron thicknesses.

Micro-transfer printable elements in accordance with some embodiments of the present invention can be constructed using foundry fabrication processes used in the art. Layers of materials can be used, including materials such as metals, oxides, nitrides and other materials used in the integrated-circuit art. Each element can be or include a complete semiconductor integrated circuit and can include, for example, transistors. Elements can have different sizes, for example, 1000 square microns or 10,000 square microns, 100,000 square microns, or 1 square mm, or larger, and can have variable aspect ratios, for example 1:1, 2:1, 5:1, or 10:1. Elements can be rectangular or can have other shapes.

Certain embodiments of the present invention provide advantages over components made using other printing methods described in the prior art. By employing connection posts 26 and a printing method that results in micro-transfer printed elements on a system substrate 12 and connection posts 26 adjacent to the system substrate 12, a low-cost method for printing elements (e.g., multi-LED components 10) in large quantities over a system substrate 12 is provided.

Furthermore, additional process steps for electrically connecting the micro-transfer printable elements to the system substrate 12 can be obviated.

An element source wafer and micro-transfer printable elements, micro-transfer printing stamps, and system substrates 12 can be made separately and at different times or in different temporal orders or locations and provided in various process states.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section
10 multi-LED component
12 system substrate
14 contact pad
16 fuse
18 circuit
20 component substrate
22 bond pad
24 wire
26 connection post
30 light-emitting diode (LED)
31 first LED
32 second LED
33 third LED
40 common electrode
41 first electrode
42 second electrode
43 third electrode
51 first LED contact
52 second LED contact
60 broken tether
70 photo-sensor
100 provide fused LED component step
110 test fused LED component step
120 compare test to LED standard step
130 test passed step
140 apply electrical power and blow fuses step
150 done step
160 provide LED standard step

What is claimed:

1. A multi-LED component, comprising:
   a component substrate having a first side and a second side, wherein the first side is opposite the second side;
   a common electrode, a first electrode, and a second electrode disposed on, in, or over the first side of the component substrate; and
   a plurality of first LEDs and a plurality of second LEDs both disposed on, in, or over the first side of the component substrate, each first LED comprising a first LED contact and a second LED contact and each second LED comprising a first LED contact and a second LED contact, wherein the first LED contact and second LED contact of each of the plurality of first LEDs and the plurality of second LEDs are for providing power to the corresponding LED to cause the corresponding LED to emit light, wherein:
   the first LED contact of each first LED and the first LED contact of each second LED is at least indirectly electrically connected to the common electrode,
   the second LED contact of each first LED is at least indirectly electrically connected to the first electrode,
   the second LED contact of each second LED is at least indirectly electrically connected to the second electrode, and
   the first LEDs of the plurality of first LEDs are electrically connected in parallel and the second LEDs of the plurality of second LEDs are electrically connected in parallel.

2. The multi-LED component of claim 1, wherein at least one of the plurality of first LEDs is disposed between two or more of the plurality of second LEDs.

3. The multi-LED component of claim 1, wherein the plurality of first LEDs emit light of a first color and the plurality of second LEDs emit light of a second color different from the first color.

4. The multi-LED component of claim 1, comprising a system substrate with a circuit that is electrically connected to the common electrode, the first electrode, and the second electrode.

5. The multi-LED component of claim 4, comprising a common bond pad, a first bond pad, and a second bond pad electrically connected to the common electrode, the first electrode, and the second electrode, respectively, wherein each bond pad is disposed on the system substrate or the component substrate.

6. The multi-LED component of claim 1, wherein the plurality of first LEDs and the plurality of second LEDs are micro-transfer printed LEDs that each comprise a broken tether.

7. The multi-LED component of claim 1, comprising common, first, and second connection posts electrically connected to the common, first, and second electrodes, respectively.

8. The multi-LED component of claim 4, wherein the component substrate is located between the system substrate and the plurality of first LEDs.

9. The multi-LED component of claim 4, wherein the plurality of first LEDs are located between the system substrate and the component substrate.

10. The multi-LED component of claim 1, comprising a third electrode formed on or over the component substrate and a third plurality of third LEDs disposed on, in, or over the first side of the component substrate, each third LED comprising a first LED contact and a second LED contact for providing power to the third LED to cause the third LED to emit light, wherein
- the first LED contact of each third LED is at least indirectly electrically connected to the common electrode, and
- the second LED contact of each third LED is at least indirectly electrically connected to the third electrode.

11. The multi-LED component of claim 10, wherein at least one of the plurality of third LEDs is disposed closer to a first LED of the plurality of first LEDs and closer to a second LED of the plurality of second LEDs than to another third LED of the plurality of third LEDs.

12. The multi-LED component of claim 1, comprising a first connection pad for electrically connecting to the first electrode and a second connection pad for electrically connecting to the second electrode and at least one fuse electrically connected in series between at least one of (i) the first electrode and the first connection pad and (ii) the second electrode and the second connection pad.

13. The multi-LED component of claim 12, comprising a fuse electrically connected in series with an LED and wherein the fuse is electrically non-conductive.

14. The multi-LED component of claim 1, comprising a common connection pad for electrically connecting to the common electrode and a fuse electrically connected in series between the common electrode and the common connection pad.

15. The multi-LED component of claim 1, wherein the plurality of first LEDs emit light of a first color, the plurality of second LEDs emit light of a second color different from the first color, and the plurality of third LEDs emit light of a third color different from the first color and different from the second color; and
- wherein the number of first LEDs in the plurality of first LEDs is different from the number of second LEDs in the plurality of second LEDs, the number of first LEDs in the plurality of first LEDs is different from the number of third LEDs in the plurality of third LEDs, or the number of second LEDs in the plurality of second LEDs is different from the number of third LEDs in the plurality of third LEDs.

16. The multi-LED component of claim 1, comprising a fuse electrically connected in series between at least one of (i) the second LED contact of each first LED of the plurality of first LEDs and the first electrode and (ii) the second LED contact of each second LED of the plurality second LEDs and the second electrode.

17. The multi-LED component of claim 1, comprising one or more photo-sensors sensitive to the light emitted by at least one of the plurality of first LEDs and the plurality of second LEDs, disposed on the second side of the component substrate, wherein the one or more photo-sensors optionally comprise at least one of one or more color filters and an infrared blocking filter.

18. The multi-LED component of claim 1, comprising one or more photo-sensors sensitive to the light emitted by at least one of the plurality of first LEDs and the plurality of second LEDs, disposed on the first side, wherein the one or more photo-sensors optionally comprise at least one of one or more color filters and an infrared blocking filter.

19. The multi-LED component of claim 1, comprising a fuse electrically connected in series between the first LED contact of each first LED of the plurality of first LEDs and the common electrode.

20. A method of using a multi-LED component, comprising:
- providing a multi-LED component, the multi-LED component comprising
  - a component substrate having a first side and a second side, wherein the first side is opposite the second side,
  - a common electrode, a first electrode, and a second electrode disposed on, in, or over the first side of the component substrate,
  - a plurality of first LEDs and a plurality of second LEDs both disposed on, in, or over the first side of the component substrate, each first LED comprising a first LED contact and a second LED contact and each second LED comprising a first LED contact and a second LED contact, wherein the first LED contact and second LED contact of each of the plurality of first LEDs and the plurality of second LEDs are for providing power to the corresponding LED to cause the corresponding LED to emit light, and
  - a fuse electrically connected in series with an LED, wherein:
    - the first LED contact of each first LED and the first LED contact of each second LED is at least indirectly electrically connected to the common electrode,
    - the second LED contact of each first LED is at least indirectly electrically connected to the first electrode,
    - the second LED contact of each second LED is at least indirectly electrically connected to the second electrode,
    - the first LEDs of the plurality of first LEDs are electrically connected in parallel and the second LEDs of the plurality of second LEDs are electrically connected in parallel, and
    - the LED is a defective LED; and
- applying electrical power to the common electrode and at least one of the first electrode and the second electrode so that the fuse connected in series to the defective LED is rendered non-conductive.

* * * * *